US007749922B2

(12) United States Patent
Bezryadin et al.

(10) Patent No.: US 7,749,922 B2
(45) Date of Patent: Jul. 6, 2010

(54) NANOWIRE STRUCTURES AND ELECTRICAL DEVICES

(75) Inventors: Alexey Bezryadin, Champaign, IL (US); Mikas Remeika, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 284 days.

(21) Appl. No.: 11/417,370

(22) Filed: May 4, 2006

(65) Prior Publication Data
US 2007/0040191 A1 Feb. 22, 2007

Related U.S. Application Data

(60) Provisional application No. 60/678,115, filed on May 5, 2005.

(51) Int. Cl.
*H01L 29/76* (2006.01)
(52) U.S. Cl. .............. 438/795; 977/936; 977/937; 977/938; 257/E21.404; 257/E21.408; 257/E29.322; 257/E39.013; 257/E49.003
(58) Field of Classification Search ............ 257/213, 257/E21.404, E21.408, E29.322, E39.013, 257/E49.003; 977/702, 704, 727, 937
See application file for complete search history.

(56) References Cited

U.S. PATENT DOCUMENTS

| | | | |
|---|---|---|---|
| 6,313,478 B1 * | 11/2001 | Lee et al. ................ | 257/8 |
| 6,664,123 B2 * | 12/2003 | Kim et al. ................ | 438/20 |
| 6,872,645 B2 | 3/2005 | Duan et al. | |
| 2005/0139819 A1 * | 6/2005 | Hwang et al. ............ | 257/14 |
| 2006/0008942 A1 * | 1/2006 | Romano et al. .......... | 438/99 |

OTHER PUBLICATIONS

A. Dibos et al, "Characterization of DNA-Templated Metal Nanowires DNA Molecules as Templates for Ultrathin Metallic Nanowires", 2003, pp. 1-6.*
A. Nakajima et al, "Conduction mechanism of Si single-electron transistor having a one-dimensional regular array of multiple tunnel junctions", Jul. 22, 2002, Applied Physics Letters, vol. 81, No. 4, pp. 733-735.*
S.F. Hu et al, "Fabrication of silicon nanowire structures based on proximity effects of electron beam lithography", 2004, Solid State Communications, vol. 130, pp. 111-114.*

(Continued)

*Primary Examiner*—David Vu
*Assistant Examiner*—Suberr Chi
(74) *Attorney, Agent, or Firm*—Greenlee, Winner and Sullivan, P.C.

(57) ABSTRACT

The present invention provides structures and devices comprising conductive segments and conductance constricting segments of a nanowire, such as metallic, superconducting or semiconducting nanowire. The present invention provides structures and devices comprising conductive nanowire segments and conductance constricting nanowire segments having accurately selected phases including crystalline and amorphous states, compositions, morphologies and physical dimensions, including selected cross sectional dimensions, shapes and lengths along the length of a nanowire. Further, the present invention provides methods of processing nanowires capable of patterning a nanowire to form a plurality of conductance constricting segments having selected positions along the length of a nanowire, including conductance constricting segments having reduced cross sectional dimensions and conductance constricting segments comprising one or more insulating materials such as metal oxides.

20 Claims, 10 Drawing Sheets

OTHER PUBLICATIONS

Zandbergen et al, "Sculpting Nanoelectrodes with a Transmission Electron Beam for Electrical and Geometrical Characterization of Nanoparticles", 2005, NanoLetters, vol. 5, No. 3, pp. 549-553).*

Averin et al. (1992) "Possible Applications of the Single Charge Tunneling," In; Single Chrage Tunneling: Coulomb Blockade Phenomena in Nanostructures, Grabert et al. Eds., NATO ASI Series. Series B: Physics, vol. 294, Plenum Press, New York, NY, pp. 311-332.

Ba et al. (Dec. 1, 1996) "Electron Bean Induced Crystallization of a Ge-Au Amorphous Film," J. Appl. Phys. 80 (11):6170-6174.

Beloborodov et al. (2003) "Transport Properties of Granular Metals at Low Temperatures," Phys. Rev. Lett. 91 (24):246801;1-4.

Bezryadin et al. (Feb. 16, 2005) "Superconducting Nanowires Templated by Single Molecules," :3761-3773.

Bezryadin et al. (Apr. 27, 2000) "Quantum Suppression of Superconductivity in Ultrathin Nanowires," Nature 404:971-974.

Bezryadin, A. (Dec. 1, 2004) "Magnetic Field Conversion of Carbon Nanotubes Between Metallic and Seimiconducting States," Seminar, Center for Nanoscale Science and Technology, Nano-CEMMS, 1005 Beckman Institute, Abstract.

Bezryadin et al. (1997) "Nanofabrication of Electrodes with Sub-5 nm Spacing for Transport Experiments on Single Moecules and Metal Clusters," Vac. Sci. Technol. B. 15(4):793-799.

Bollinger et al. (2004) "Effect of Morphology on the Superconductor-Insulator Transition in One-Dimensional Nanowires," Phys. Rev. B. 69:180503.

Braun et al. (1998) "DNA-Templated Assembly and Electrode Attachment of a Conducting Silver Wire," Nature 391:775-778.

Coskun et al. (May 21, 2004) "h/e Magnetic Flux Modulation of the Energy Gap Nanotube Quantum Dots," Science 304:1132-1134.

Devoret et al. (1992) "Introduction to Single Charge Tunneling," In; Single Chrage Tunneling: Coulomb Blockade Phenomena in Nanostructures, Grabert et al. Eds., NATO ASI Series. Series B: Physics, vol. 294, Plenum Press, New York, NY, pp. 1-19.

Ferrel, C.R. (1956) "Angular Dependence of the Characteristic Energy Loss of Electrons Passing Through Metal Foils," Phys. Rev. 101:554-563.

Furuya et al. (2003) "Position and Size Controlled Fabrication of Nano-Metals and—Semiconductors with Fine Focused Electron Beam," Rev. Adv. Mater. Sci. 5:381-386.

Graybeal et al.(1987) "Apparent Destruction of Superconductivity in the Disordered One-Dimensional Limit," Phys. Rev. Lett. 59(23):2697-2700.

Hadley et al. (2000) "Quantum Nanocircuits: Chips of the Future," In; Quantum Semiconductor Devices and Technologies, Pearsall, T. ed., Kluwar Academic Publishers, Boston, MA.

Hadley et al. (1998) "Single-Electron Tunneling Devices," In; Lectures on Semiconductivity in Networks and Mesoscopic Systems, Giovannella et al. eds., AIP Conference Proceedings 427, Woodbury, New York, pp. 256-270.

Hobbs, L.W. (1979) "Radiation Effects in Analysis of Inorganic Specimens by TEM," In; Introduction to Analytical Electron Microscopy, Hren et al. eds., Plenum Press, New York, pp. 437-480.

Inokuti, M (1971) "Inelastic Collisions of Fast Charged Particles with Atoms and Molecules—The Bethe Theory Revisited," Rev. Mod. Phys. 43:297-347.

Jencic et al. (Jul. 15, 1995) "Electron-Beam-Induced Crystallization of Isolated Amorphous Regions in Si, Ge, GaP, and GaAs," J. Appl. Phys. 78(2):974-982.

Joy, D.C. (1984) "SEM Beam Interactions, Contrast and Resolution in the SEM," J. Microsc. 136:241-259.

Kondo et al. (Jul. 28, 2000) "Synthesis and Characterization of Helical Multi-Shell Gold Nanowires," Science 289:606-608.

Kondo et al. (Nov. 3, 1997) "Gold Nanobridge Stabilized by Surface Structure," Phys. Rev. Lett. 79(18):3455-3458.

Kramers, M.A. (1923) "On the Theory of X-Ray Absorption and of the Continuous X-Ray Spectrum," Phil. Mag. 46:836-871.

Laidler et al. (1975) "Application of High-Voltage Electron Microscopy to the Study of Radiation Damage in Metals," In; Physical Aspects of Electron Microscopy and Microbeam Analysis, Siegel et al. eds., Wiley, Noew York, pp. 103-128.

Langer et al. (1976) "Intrinsic Resistive Transition in Narrow Superconducting Channels," Phys. Rev. 164:498-510.

Lulli et al. (Nov. 15, 1987) "Solid-Phase Epitaxy of Amorphous Silicon Induced by Electron Irradiation at Room Temperature," Phys. Rev. B 36(15):8038-8042.

Mayadas et al. (1972) "Electrical Characteristics of rf-Sputteres Single-Crystal Niobium Films," 43(3):1287-1289.

McCumber et al. (1970) "Time Scale of Intrinsic Restrictive Fluctuations in Thin Superconducting Wires," Phys. Rev. B 1:1054-1070.

Mooney et al. (1984) "Defect Creation by Subthreshold Irradiation in Semiconductors," Phys. Rev. B. 29(4):1962-1965.

Moseley, H.E.G. (1914) "The High-Frequency Spectra of the Elements," Phil. Mag. 26:1024-1034.

Oshima et al. (2003) "Development of Miniature STM Holder for Study of Electronic Conductance of Metal Nanowires in UHV-TEM," Surf. Sci. 531:209-216.

Oshima Y. (2004) "A Study of Metal Nanowire Structures by High-Resolution Transmission Electron Microscopy," JEOL News 39(2):8-12.

Phillipp et al. (1979) "Energy and Orientation Dependence of Atom Displacement in BCC Metals Studied by High-Voltage Electron Microscopy," Phys. Lett. A 73(2):123-126.

Powell, C.J. (1976) "Cross Sections for Ionization of Inner-Shell Electrons by Electrons," Rev. Mod. Phys. 48:33-47.

Remeika et al. (2005) "Sub-10 Nanometer Fabrication: Molecular Templating, Electron-Beam Sculpting and Crystallization of Metallic Nanowires," Nanotechnol. 16(8):1172-1176.

Richter et al. (2001) "Construction of Highly Conductive Nanowires on a DNA Template," Appl. Phys. Lett. 78 (4):536-538.

Rodrigues et al. (Nov. 6, 2000) "Signature of Atomic Structure in the Quantum Conductance of Gold Nanowires," Phys. Rev. Lett. 85(19):4124-4127.

Rogachev et al. (2003) "Superconducting Properties of Polucrystalline Nb Nanowires Templated by Carbon Nanotubes," Appl. Phys. Lett. 83(3):512-514.

Takai et al. (Sep. 3, 2001) "Dynamic Observation of an Atom-Sized Gold Wire by Phase Electron Microscopy," Phys. Rev. Lett. 87(10):106105:1-4.

Troiani et al. (Apr. 25, 2003) "Direct Observation of the Mechanical Properties of Single-Walled Carbon Nanotubes and Their Junctions at the Atomic Level," Nano Lett. 3(6):751-755.

Williams et al. (1996) Transmission Electron Microscopy, vol. 1, Plenum Press: New York, NY, pp. 63.

Williams et al. (1996) Transmission Electron Microscopy, vol. 1, Plenum Press: New York, NY, pp. 65.

Zandbergen et al. (Feb. 4, 2005) "Sculpting Nanoelectrodes with a Transmission Electron Beam for Electrical and Geometrical Characterization of Nanoparticles," Nano Lett. 5(3):549-553.

Zhang et al. (2000) "Formation of Metal Nanowires on Suspended Single-Walled Carbon Nanotubes," Appl. Phys. Lett. 77(19):3015-3017.

Averin, D.V. (1998) "Adiabatic Quantum Computation With Cooper Pairs," *Solid State Commun.* 105(10):659-664.

Bezryadin, A. (Aug. 6, 2003) "Carbon Nanotubes, DNA, and Superconductivity," Presentation for REU Meeting, Aug. 6, 2003.

Bezryadin et al. (Sep. 1, 1997) "Electrostatic Trapping of Single Conducting Nanoparticles Between Nanoelectrodes," *Appl. Phys. Lett.* 71(9) 1273-1275.

Büchler et al. (Feb. 12, 2004) "Quantum Fluctuations in Thin Superconducting Wires of Finite Length," *Phys. Rev. Lett.* 92(6):067007.

Caldeira et al. (Jan. 26, 1981) "Influence of Dissipation on Quantum Tunneling in Macroscopic Systems," *Phys. Rev. Lett.* 46(4):211-214.

Chen et al. (Jun. 1999) "Rapid Single Flux Quantum T-Flip Flop Operating up to 770 GHz," *IEEE Trans. Appl. Superconductivity* 9(2):3212-3215.

Duan, J. (Jun. 19, 1995) "Quantum Decay of One-Dimensional Supercurrent: Rolls of Electromagnetic Field," *Phys. Rev. Lett.* 74(25):5128-5131.

Giordano, N. (Oct. 31, 1988) "Evidence for Macroscopic Quantum Tunneling in One-Dimensional Superconductors," *Phys. Rev. Lett.* 61(18):2137-2140.

Goldman et al. (Nov. 1998) "Superconducting-Insulator Transitions in the Two-Dimensional Limit," *Phys. Today* :39-44.

Graybeal et al. (Apr. 1, 1984) "Localization and Interaction in Ultrathin Amorphous Superconducting Films," *Phys. Rev. B.* 29(7):4167-4169.

Kelly et al. (Nov. 12, 1999) "Insight into the Mechanism of Sidewall Fictionalization of Single-Walled Nanotubes: an STM Study," *Chem. Phys. Lett.* 313:445-450.

Kociak et al. (Mar. 12, 2001) "Superconductivity in Ropes of Single-Walled Carbon Nanotubes," *Phys. Rev. Lett.* 86(11):2416-2419.

Lau et al. (Nov. 19, 2001) "Quantum Phase Slips in Superconducting Nanowires," *Phys. Rev. Lett.* 87(21):217003.

Likharev et al. (1985) "Theory of the Bloch-Wave Oscillations in Small Josephson Junctions," *J. Low Temp. Phys.* 59(3-4):347-382.

Likharev et al. (Jan. 1979) "Superconducting Weal Links," *Rev. Mod. Phys.* 51(1):101-159.

Lukens et al. (Oct. 26, 1970) "Onset of Quantized Thermal Fluctuations in 'One-Dimensional' Superconductors," *Phys. Rev. Lett.* 25(17):1180-1184.

Makhlin et al. (Apr. 2001) "Quantum-State Engineering with Josephson-Junction Devices," *Rev. Mod. Phys.* 73(2):357-400.

Matveev et al. (Aug. 26, 2002) "Persistent Current in Superconducting Nanorings," *Phys. Rev. Lett.* 89(9):096802.

Mermin et al. (Nov. 28, 1966) "Absence of Ferromagnetism or Antiferromagnetism in One-or Two-Dimensional Isotropic Heisenberg Models," *Phys. Rev. Lett.* 17(22)1133-1136.

Miyazaki et al. (Nov. 4, 2002) "Quantum Phase Transition in One-Dimensional Arrays of Resistively Shunted Small Josephson Junctions," *Phys. Rev. Lett.*89(19):197001.

Mooij et al. (Jul. 1, 1985) "Propagating Plasma Mode in Thin Superconducting Filaments," *Phys. Rev. Lett.* 55(1):114-117.

Murphey et al. (2002) "DNA-Templated Nanowires in the 10nm Regime," REU Papers, Department of Physics, University of Illinois at Urbana-Champaign, 5 pages.

Nakamura et al. (Apr. 29, 1999) "Coherent Control of Macroscopic Quantum States in a Single-Cooper-Pair Box," *Nature* 398:786-788.

Newbower et al. (Feb. 1, 1972) "Fluctuation Effects on the Superconducting Transition of Tin Whisker Crystals," *Phys. Rev. B.* 5(3):864-868.

Oreg et al. (Jul. 5, 1999) "Suppression of $T_c$ in Superconducting Amorphous Wires," *Phys. Rev. Lett.* 83(1):191-194.

Orlando et al. (Dec. 1, 1999) "Superconducting Persistent-Current Qubit," *Phys. Rev. B* 60(22) 15398-15413.

Park et al. (Aug. 18, 1986) "Superconducting Tunneling in Ultrathin Nb Films," *Phys. Rev. Lett.* 57(7):901-904.

Penttilä et al. (Feb. 1, 1999) "Superconductor-Insulator Transition in a Single Josephson Junction," *Phys. Rev. Lett.* 82(5):1004-1007.

Refael et al. (2003) "Dissipation and Quantum Phase Transitions of a Pair Josephson Junctions," *Phys. Rev. B* 68(21):214515.

Richter et al. (Jan. 22, 2001) "Construction of Highly Conductive Nanowires on a DNA Template," *Appl. Phys. Lett.* 78(4):536-538.

Rogachev et al. (Jul. 21, 2003) "Superconducting Properties of Polycrystalline Nb Nanowires Templated by Carbon Nanotubes," *Appl. Phys. Lett.* 83(3):512-514.

Schmid, A. (Oct. 24, 1983) "Diffusion and Localization in a Dissipative Quantum System," *Phys. Rev. Lett.* 51(17):1506-1509.

Schön et al. (1990) "Quantum Coherent Effects, Phase Transitions, and the Dissipative Dynamics of Ultra Small Tunnel Junctions," *Phys. Rep.* 198(5-6):237-412.

Skalare et al. (Mar. 11, 1996) "Large Bandwidth and Low Noise in a Diffusion-Cooled Hot-Electron Bolometer Mixer," *Appl. Phys. Lett.* 68(11):1558-1560.

Smith et al. (Feb. 12, 2001) "Width and Magnetic-Field Dependence of the Transition Temperature in Ultranarrow Superconducting Wires," *Phys. Rev. B* 63:094513.

Song, Y. (Jun. 1976) "Origin of 'Capacitance' in Superconducting Microbridges," *J. Appl. Phys.* 47(6):2651-2655.

Tinkham et al. (Oct. 17, 2003) "Hysteric $I$-$V$ Curves of Superconducting Nanowires," *Phys. Rev. B* 68:134515.

Tinkham et al. (Apr. 22, 2002) "Quantum Limit to Phase Coherence in Thin Superconducting Wires," *Appl. Phys. Lett.* 80(16):2946-2948.

van Run et al. (1987) "Superconducting Phase Coherence in Very Weak Aluminum Strips," *Jap. J. Appl. Phys.* 26 (Supp 26-3):1765-1766.

Xiong et al. (Feb. 3, 1997) "Negative Magnetoresistance in Homogeneous Amorphous Superconducting Pb Wires," *Phys. Rev. Lett.* 78(5):927-930.

Yazdani et al. (Apr. 10, 1995) "Superconducting-Insulating Transition in Two-Dimensional α-MoGe Thin Films," *Phys. Rev. Lett.* 74(15):3037-3040.

Zaikin et al. (Feb. 24, 1997) "Quantum Phase Slips and Transport in Ultrathin Superconducting Wires," *Phys. Rev. Lett.*78(8):1552-1555.

Zaikin et al. (1998) "Quantum Fluctuations and Dissipation in Thin Superconducting Wires," *Phys.-Usp.* 41:226-230.

\* cited by examiner

NANOWIRE STRUCTURES AND ELECTRICAL DEVICES

CROSS REFERENCE TO RELATED APPLICATIONS

This application claims priority under 35 U.S.C. 119(e) to U.S. provisional Patent Application 60/678,115 filed May 5, 2005, which is hereby incorporated by reference in its entirety to the extent not inconsistent with the disclosure herein.

STATEMENT REGARDING FEDERALLY SPONSORED RESEARCH OR DEVELOPMENT

This invention was made, at least in part, with United States governmental support awarded by Department of Energy Grant DEFG02-91ER45439 and National Science Foundation Grant DMR01-34770. The United States Government has certain rights in this invention.

BACKGROUND OF INVENTION

The development of new techniques and processing methods for manipulating, organizing and integrating matter on the scale of nanometers is critically important to continued advances in the field of nanotechnology. These advances are expected to widely impact fundamental and applied technology areas ranging from materials science and physics to applied engineering and biotechnology. Furthermore, progress in the field of nanotechnology is anticipated to enable a new class of devices based on nanoscale electrical, mechanical, magnetic and/or optical elements. Such nanotechnology enabled devices are predicted to revolutionize an incredibly diverse range of fields including sensing, electronics, optoelectronics, photovoltaics, fluidics, quantum computing, biotechnology and medicine.

Fabrication of devices with elements having nanoscale dimensions is not merely a natural extension of the concept of miniaturization, but a fundamentally different regime in which physical and chemical behavior substantially deviates from larger scale systems. The behavior of nanoscale assemblies of many materials is greatly influenced by their large interfacial volume fractions and quantum mechanical effects arising from electronic confinement. The ability to make structures having well-defined features on the scale of nanometers has opened up the possibility of making devices based on these properties and processes only occurring in the nanoscale domain. For example, there is currently great interest in developing useful functional devices based on controlled single-electron tunneling, Coulomb blockage and quantum size effects.

Single electron tunneling (SET) transistors are one class of nanoscale devices of particular interest due to their very small dimensions and low power dissipation, which make them ideal candidates for making dense integrated electronic circuits, such as logic and memory circuits. A SET transistor is a three terminal device comprising an active element, commonly referred to as a Coulomb island, coupled to source and drain electrodes via high resistance tunnel junctions and coupled to a gate electrode that it is capable of electrostatically influencing electrons transported between source and drain electrodes. The presence of the tunnel junctions prevents mixing of the electronic states of electrons on the Coulomb island with external states, thereby achieving substantial electronic confinement and isolation. The energy of an electron must be equal the Coulomb energy ($e^2/2C$) for it to be transported onto the Coulomb island and charge passes through the Coulomb island in quantized units. In typical operation, when both the gate and bias voltage between source and drain electrodes are equal to zero, electrons do not have enough energy to enter the Coulomb island and charge does not flow. As the bias voltage is increased, however, the system reaches the Coulomb energy and electrons flow between the source and drain electrodes. In metallic and superconducting SET transistors where the charging energy is significantly larger than the confinement energy, the current that flows from source to drain electrodes is a periodic function of the gate voltage. On the other hand, the current that flows from source to drain electrodes is not a strictly periodic function of the gate voltage in semiconducting SET transistors where the charging energy is on the same order of magnitude as the confinement energy.

Continued advancement of useful nanotechnology based devices, such as SET transistors, is critically dependent on the developing commercially practicable methods of fabricating sub-micrometer sized structures from a range of materials including metals, semiconductors, superconductors and dielectrics. Recent advances in photolithography have extended the applicability of these techniques to the fabrication of structures having submicron physical dimensions. For example, nanolithographic techniques, such as deep UV projection mode lithography, soft X-ray lithography, electron beam lithography and scanning probe methods, have been successfully employed to fabricate structures with features on the order of 10s to 100s of nanometers. These developments have enabled fabrication of a wide range of functional devices having integrated active nanoscale elements including metallic, superconducting and semiconducting SETs; quantum dot optical detection systems; nanowire, nanocrystal and thin film based transistors and photovoltaic devices; nanoelectromechanical systems; and nanofluidic systems.

Despite these advances, techniques capable of fabricating structures having even smaller physical dimensions are needed to enable many useful nanotechnology based devices. For example, a significant problem of SET transistors fabricated using photolithography methods and having a Coulomb island with physical dimensions equal to or greater than about 20 nanometers is that they must be cooled down to low temperatures to achieve useful device performance. The fundamental problem with these devices is that the Coulomb blockage is washed out via thermal fluctuations if the energy that is necessary to add an electron to the Coulomb island is smaller than the characteristic thermal energy ($k_B T$). Therefore, to achieve SETs exhibiting good device performance at room temperature requires a reduction in the scale of their physical dimensions to about ~10 nm or less to access good device performance. This requirement occurs because the relevant internal energy scale must be much larger than the energy of thermal fluctuations. In SET transistors, for example, the relevant energy scale is the Coulomb charging energy, $E_C = e^2/2C = e^2/4\pi\epsilon_0 D$. Here C is the total electric capacitance of the active element of the device (so-called Coulomb island), which is assumed to be spherical, D is the diameter of the Coulomb island, $\epsilon_0$ is the permittivity of free space. The condition for the room temperature operation is written as $E_C \gg E_{th} = k_B T = 4 \cdot 10^{-21}$ J (here T=293K is the "room temperature"). This requirement translates into a size restriction for the Coulomb island D<5.8 nm (assuming the condition $E_C = 10 E_{th}$). Fabrication of electronic devices and device components with dimensions below 10 nm, however, remains very challenging.

It will be appreciated from the foregoing that there is currently a need for new powerful nanofabrication techniques capable of producing metallic and/or semiconductor structures having physical dimensions below 10 nm. It is therefore a goal of the present invention to provide methods for generating sub 10 nanometer structures with high resolution. Further it is a goal of the present invention to provide methods of making and integrating active elements having sub-10 nanometer dimensions in functional devices, including SET transistors and integrated circuits comprising interconnected SETs.

SUMMARY OF THE INVENTION

The present invention provides structures and devices comprising conductive segments and conductance constricting segments of a nanowire, such as metallic, superconducting or semiconducting nanowires. Particularly, structures of the present invention comprise conductive segments and conductance constricting segments having positions along the length of a nanowire selected with good placement accuracy. In addition, the present invention provides structures and devices comprising conductive nanowire segments and conductance constricting nanowire segments having accurately selected phases including crystalline and amorphous states, compositions, morphologies and physical dimensions, including selected cross sectional dimensions, shapes and lengths along the length of a nanowire. Further, the present invention provides methods of processing nanowires capable of patterning a nanowire to form a plurality of conductance constricting segments having selected positions along the length of a nanowire, including conductance constricting segments having reduced cross sectional dimensions and conductance constricting segments comprising one or more insulating materials such as metal oxides. Processing methods of the present invention are capable of providing local modification of the shape of selected regions of a nanowire with a resolution equal to about 3 nanometers.

In one aspect, the present invention provides a nanowire having a pattern of conductive segments and conductance constricting segments. In the context of this description, "nanowire" generally refers to any elongated conductive or semiconductive structure having a diameter or thickness that is less than or equal to about 50 nanometers, preferably for some applications less than or equal to about 20 nanometers. Nanowires and nanowire structures of the present have an aspect ratio (i.e., ratio of length to width) greater than or equal to about 10, and preferably for some applications greater than or equal to about 50. Nanowires of the present invention may be conducting, semiconducting or super conducting. Nanowire structures of the present invention include heterostructures comprising a nanowire supported by a linear or nonlinear molecular template such as a carbon nanotube, carbon fiber, boron nitride nanotube, oligonucleotide, single stranded DNA, double stranded DNA, single stranded RNA, double stranded RNA, peptide, protein, actin fiber, microtubulus or any combination of these materials. Nanowires of the present invention may comprise one or more metals, metal oxides, metal alloys, semiconductors, doped materials (including but not limited to, doped semiconductors) and combinations of these materials, including but not limited to AuPd, Os, MoGe, and Nb. Generally, any material that can be sputtered (i.e., anything that conducts) is useable in the present methods. Nanowires of the present invention may be crystalline, polycrystalline, amorphous, and partially amorphous. Nanowires of the present invention may consist of a plurality of different segments having different compositions, physical dimensions (e.g. diameter, radius, thickness, width and length) and phases (e.g. amorphous, crystalline, different crystalline phases etc.). As used herein in this context the term "segment", refers to a portion, element or a component of a nanowire or nanowire structure and includes conductive segments and conductance constricting segments. Multisegment nanowires and nanowire segments of the present invention may be a unitary (e.g. a monolithic, physically continuous structure) structure or a non-unitary (i.e. comprising physically discrete and/or separated segments) structures. The present invention includes nanowire structures comprising a one or more longitudinally oriented nanowires, wherein the nanowire(s) is oriented such that it longitudinally extends to within 30 degrees of a selected direction, preferably to within 10 degrees of a selected direction.

In one embodiment, a nanowire of the present invention comprises a first conductance constricting segment and a second conductance constricting segment, wherein first and second conductance constricting segments are separated by and are in electrical contact with, a middle conductive segment. In this embodiment of the present invention, the first conductance constricting segment, second conductance constricting segment and middle conductive segment are each components, optionally integrated components, of the conductive nanowire. Optionally, nanowires of this aspect of the present invention may further comprise any number of additional conductance constricting segments and additional conductive segments also provided as components, optionally integrated components, of the conductive nanowire. In the context of this description, "integrated components", such as conductive and conductance constricting segments, of a nanowire or nanowire structure are in electrical contact such that electrons are capable of migrating from one component to another under some useful conditions (e.g., temperatures, or in the presence of an electric field etc.). In some embodiments, integrated components of the present invention are connected so as to form a conductive, semiconductive or superconductive nanowire or nanowire structure. In some embodiments of the present invention, integrated components comprise a structurally continuous nanowire or nanowire structure, such as a unitary (e.g., a monolithic, physically continuous structure) nanowire or nanowire structure. In some embodiments of the present invention, however, integrated components comprise discrete components of a non-unitary nanowire or nanowire structure, such as an embedded grain in a nanowire or nanowire structure. Integrated components may comprise components having different phases, different compositions, different morphologies and/or different physical dimensions. In some embodiments, integrated components comprise discrete components in physical contact, such as a series of conductance constricting and conductive segments, wherein adjacent segments are in physical contact with each other.

First conductance constricting segments, second conductance constricting segments and/or the middle conductive segments of this aspect of the present invention may have electrical properties, such as conductances, electrical resistances and capacitances, selected for a given application, such as use in a nanoelectrical or nanoelectromechanical device. For example, in one useful embodiment the first conductance constricting segment, second conductance constricting segment or both have a resistance equal to or greater than about 12 k$\Omega$, and preferably for some applications equal to or greater than about 25 k$\Omega$. Alternatively, first conductance constricting segment, second conductance constricting segment or both may comprise thin insulating nanowire segments, such as metal oxide segments. High resistance and/or insulating conductance constricting segments are useful for limiting the propagation of electrons in a manner localizing the electronic wave functions of electrons in the middle conductive segment, for example to generate a middle conductive segment comprising a Coulomb island. In one embodiment, for example, the presence of first and second high resistance and/or insulating conduction constricting segments prevents mixing of the electronic states of electrons on the middle conductive segment with external states, thereby providing electron confinement in a Coloumb island of a SET transistor. The present invention also provides nanowire configurations having a middle conductive element with a capacitance low enough to provide a charging energy that is greater, for example a factor of 10 times greater, than thermal electronic fluctuations at a selected temperature, such a capacitance low enough to provide a charging energy that is less than thermal electronic fluctuations at room temperature (298K).

First conductance constricting segments, second conductance constricting segments and/or middle conductive segments of this aspect of the present invention may have physical dimensions, such as cross sectional dimensions, and lengths along the length of a nanowire, selected for a given application, such as use in a nanoelectrical or nanoelectromechanical device. Accurate selection of the physical dimensions of conductance constricting segments and middle conductive segments provides components, optionally integrated components, of a nanowire having well defined and useful electrical, mechanical and thermal properties. In one embodiment of the present invention, the physical dimensions of conductive and/or conduction constricting segments may be selected to be within about 10 nanometers, preferably for some applications to within 6 nanometers, and more preferably for other applications to within 3 nanometers.

In an embodiment, conductance constricting segments of the present invention have average cross sectional dimensions equal to about 6 nanometers or less, and preferably for some applications equal to about 3 nanometers or less. In an embodiment, conductance constricting segments of the present invention extend along the length of the nanowire distances equal to a value selected over the range of about 1 nanometer to about 100 nanometers. Selection of the cross sectional dimension and length provides conductance constricting segments having an accurately selected electrical resistance, including high resistance conductance constricting segments. Selection of narrow cross sectional dimensions, for example cross sectional dimensions less than about 5 nanometers, allows fabrication of insulating conductance constricting segments via oxidation initiated by exposure of narrow conductance constricting segments to an oxidizing medium such as oxygen.

In an embodiment, the middle conductive segment has an average cross sectional dimension equal to or less than about 10 nanometers, more preferably for some applications equal to or less than about 6 nanometers. In an embodiment, the middle conductive segment extends along the length of the nanowire a distance equal to or less than about 20 nanometers, more preferably for some applications equal to or less than about 10 nanometers. Selection of small cross sectional dimensions, for example cross sectional dimensions less than about 6 nanometers, and short lengths, for example lengths less than about 10 nanometers, achieves capacitances and charging energies providing middle conductive segments useful as Coulomb islands in SET transistors.

First conductance constricting segments, second conductance constricting segments and/or middle conductive segments of this aspect of the present invention may have selected phases, including crystalline and amorphous states, shapes, morphologies and compositions providing useful electrical, mechanical and thermal properties. In one embodiment, for example, conductance constricting segments of the present invention are amorphous segments extending a selected distance along the length of the nanowire. Conductance constricting segments comprising an amorphous metal and extending a selected length, for example, scatter electrons passing through them in a manner establishing a desired electrical resistance, including a high electric resistance. In another embodiment, conductance constricting segments comprise a segment of a nanowire having a hole, such as a hole extending entirely through the nanowire. In this embodiment, the physical dimensions (e.g. diameter) of the hole establishes a desired electric resistance. Other useful shapes of conductance constricting segments include shapes exhibiting a tapered profile such as neck, waist and hourglass shapes. In another embodiment, conductance constricting segments of the present invention comprise a very thin insulating segment of the nanowire (e.g. extending a distance along the nanowire less than about 10 nanometers, more preferably for some application less than about 5 nanometers), including but not limited to nanowire segments comprising a metal oxide or semiconductor oxide material. Use of such insulating conductance constricting segments is beneficial for providing tunneling junctions in nanoelectrical and nanoelectromechanical devices, such as SET transistors.

In one embodiment, the positions of conductance constricting segments and conductive segments along the length of the nanowire are selected with great placement accuracy. For example, selection of the positions of first and second position of conductance constricting segments along the length of a nanowire to within about 10 nanometers or less provides a means of selecting the length of the middle conductive segment with good accuracy In another aspect, the present invention provides processing methods for patterning a conductive nanowire to form a plurality of conductive segments and conductance constricting segments. In one embodiment, a nanowire is provided and a selected first region of the nanowire exposed to a focused beam of electrons, thereby generating a first conductance constricting segment. A second selected region of the nanowire is exposed to the focused beam of electrons, thereby generating a second conductance constricting segment. The position of first and second regions of the nanowire exposed to the focused electron beam is selected such that first and second conductance constricting segments are separated by and in electrical contact with a middle conductive segment of the nanowire. As result of the processing, first conductance constricting segment, second conductance constricting segment and middle conductive segment are each provided as components, optionally integrated components, of the conductive nanowire. Optionally, this aspect of the present invention may further comprise exposing additional regions of the nanowire to the focused electron beam thereby generating additional conductance constricting segments.

Fabrication of conduction constricting segments by exposure of a nanowire to a focused electron beam may be achieved in the present invention in a number of ways. In one embodiment, exposing one or more regions of the nanowire to the focused beam of electrons locally etches a portion of the nanowire, thereby generating at least one conductance constricting segment. In another embodiment, exposing one or more regions of the nanowire to the focused beam of electrons locally melts a portion of the nanowire thereby generating at least one conductance constricting segment. In another embodiment, exposing one or more regions of the nanowire to the focused beam of electrons locally crystallizes a portion of the nanowire thereby generating at least one conductance constricting segment. In another embodiment, exposing one or more regions of the nanowire to the focused beam of electrons locally melts a portion of the nanowire, thereby generating an embedded grain bounded by first and said second conductance constricting segments. In this embodiment, the grain comprises the middle conductive segment of the nanowire. In another embodiment, exposing one or more regions of the nanowire to the focused beam of electrons makes a hole having a selected physical dimension in the nanowire, thereby generating at least one conductance constricting segment. Optionally, methods of these aspects of the present invention may further comprise exposing at least one of the conductance constricting segments to an oxidizing medium, such as a selected partial pressure of oxygen gas, thereby generating at least one conductance constricting segment comprising an insulating segment, such as a metal oxide segment.

In another embodiment of this aspect, the present invention provides processing methods for patterning a conductive nanowire wherein a nanowire is provided and a first region of the nanowire is exposed to a focused beam of electrons, thereby generating a grain adjacent to first and second conductive segments. The interface between the first conductive segment and the grain comprises a first conductance constricting segment, and the interface between the second conductive segment and the grain comprises a second conductance constricting segment. The step of exposing the first region of the nanowire to the focused beam of electrons may comprise locally melting a selected portion of the nanowire. As a result of processing, first conducting segment, second conducting segment and the grain are components, optionally integrated components, of the nanowire. Optionally, methods of the present invention may further comprise exposing additional regions of the nanowire to the focused beam of electrons, thereby generating one or more additional grains in the nanowire. Optionally, this method of the present invention may further comprise exposing at least a portion of the nanowire to an oxidizing medium, such as a selected partial pressure of oxygen gas, thereby oxidizing the first conduction constricting segment, the second conduction constricting segment or both.

In another aspect the present invention also provides nanowire based SET transistors and circuits comprising integrated nanowire based SET transistors. In one embodiment of this aspect, the present invention provides a single electron transistor comprising a patterned nanowire, having a pattern of conductive segments and conductance constricting segments, and a gate electrode. The patterned nanowire comprises a source electrode comprising a conductive segment of the nanowire; a first conductance constricting segment of the nanowire adjacent to and in electrical contact with the source electrode; a drain electrode comprising a conductive segment of the nanowire; a second conductance constricting segment of the nanowire adjacent to and in electrical contact with the drain electrode; and a Coulomb island comprising a conductive segment of the nanowire. The Coulomb island is positioned between the first and second conductance constricting segments and is in electrical contact with the first and second conductance constricting segments. Source electrode, drain electrode, first conductance constricting segment, second conductance constricting segment and Coloumb island are components, optionally integrated components, of said nanowire and the gate electrode is positioned proximate to the middle conductive segment of the nanowire. In one embodiment, first and second conductance constricting segments each have a resistance greater than about 12 k$\Omega$, more preferably for some applications greater than about 25 k$\Omega$. Alternatively, first and second conductance constricting segments may comprise a thin insulating segment of the nanowire (e.g. extending a distance along the length of the nanowire less than about 10 nanometers, more preferably for some applications less than about 5 nanometers).

Nanowire based SET transistors of the present invention having selected physical dimensions and electrical properties are capable of exhibiting useful electronic performance even at higher temperatures, including room temperature (298K). An exemplary nanowire based SET transistor of the present invention capable of room temperature operation has a Coloumb island with an average cross sectional dimension equal to or less than about 6 nanometers and extends a distance along the nanowire equal to or less than about 10 nanometers. In one useful embodiment, the Coloumb island is a grain embedded in the nanowire.

The processing methods of the present invention are useful for generating patterns of conducting segments and conduction constricting segments in nanowires having a wide range of compositions, including metal nanowires, semiconductor nanowires and superconducting nanowires, and in nanowires characterized by a range of phases including crystalline states and amorphous states. The present methods are useful for processing suspended nanowire structures, such as nanowires formed by molecular templating methods, and supported nanowires, such as nanowires formed from thin films deposited on a substrate surface. The present methods are capable of processing nanowires of virtually any length, including, but not limited to, nanowires having length ranging from about 10 nanometers to about 1000 nanometers.

Processing methods of the present invention provide a means for nanomachining nanostructures, such as nanowires, nanorods, nanofibers and nanocrystals. In the context of this description, the term "nanomachining" refers to changing the physical dimensions of a nanostructure or element of a nanostructure, for example, via etching, melting, sculpting, vaporizing, sputtering, or any combination of these processes. Nanomachining in the present invention also includes inducing local phase changes, such as crystallization, changing the morphology of a nanostructure or element of a nanostructure, and localized material removal to generate holes, cavities and voids in a nanostructure or element of a nanostructure. Processing methods of the present invention are also applicable to processing micron scale structures, including microwires having micron scale cross sectional dimensions.

Nanowire structures and devices of the present invention are mechanically robust, particularly when supported and/or bound to a linear template molecule.

In another aspect, the present invention provides a method of for patterning a conductive nanowire to form a plurality of conductive segments and conductance constricting segments comprising the steps of: (1) providing the nanowire; (2) exposing a first region of the nanowire to a focused beam of electrons, thereby generating a first conductance constricting segment; (3) exposing a second region of the nanowire to the focused beam of electrons, thereby generating a second conductance constricting segment, wherein the first and second conductance constricting segments are separated by and in electrical contact with a middle conductive segment of the nanowire, thereby patterning the conductive nanowire to form the plurality of conductive segments and conductance constricting segments; wherein the first conductance constricting segment, second conductance constricting segment and the middle conductive segment are components, optionally integrated components, of the nanowire. Optionally, the step of providing the nanowire comprises the step of: (i) providing a suspended linear template molecule; and (ii) depositing a thin layer of material on the suspended linear template molecule, thereby providing the nanowire.

In another aspect, the present invention provides a method for patterning a conductive nanowire to form a plurality of conductive segments and conductance constricting segments comprising the steps of: (1) providing the nanowire; (2) exposing a first region of the nanowire to a focused beam of electrons, thereby generating a grain adjacent to first and second conductive segments, wherein the interface between the first conductive segments and the grain comprises a first conductance constricting segment, wherein the interface between the second conductive segment and the grain comprises a second conductance constricting segment, thereby patterning the conductive nanowire to form the plurality of conductive segments and conductance constricting segments; wherein the first conducting segment, second conducting segment and the grain are components, optionally integrated components, of the nanowire.

In another embodiment, the invention provides a method for patterning a conductive nanowire to form a plurality of conductive segments and conductance constricting segments, wherein the focused electron beam has a current density equal to a value selected from the range of about 0.1 pA nm$^{-2}$ to 50 pA nm$^{-2}$.

In another embodiment, the invention provides a method for patterning a conductive nanowire to form a plurality of conductive segments and conductance constricting segments, wherein the step of exposing a first region of the nanowire to a focused beam of electrons and the step of exposing a second region of the nanowire to a focused beam of electrons each comprise exposing the nanowire to a net dose of electrons equal to a value selected from the range of about 10 pC nm$^{-2}$ to 100 pC nm$^{-2}$.

BRIEF DESCRIPTION OF THE DRAWINGS

FIG. 1: DNA-templated nanowires. The fabrication is done as follows: First a deep trench (~100 nm wide) is etched into a SiN/SiO$_2$/Si substrate. The trench appears black on the SEM micrographs. Double-stranded λ-DNA molecules are deposited onto SiN substrates from a dilute solution and then dried in a nitrogen gas flow. The DNA appear to stretch itself across the trench. Such suspended and stretched molecule forms an ideal substrate for metallic nanowires.

FIG. 2: DNA-templated AuPd nanowire. The fabrication is similar to FIG. 1 examples.

FIG. 3: Electron-beam induced crystallization of a Nb nanowire.

FIG. 4: Electron-beam induced crystallization of a MoGe wire.

FIG. 6.

FIG. 7: An example of a structure that functions as a single-electron-tunneling (SET) device. The structure is created within a nanowire using electron-beam etching.

FIG. 14A shows the nanowire as originally prepared via sputtering deposition and FIG. 14B shows the nanowire after annealing for 20-30 seconds with an electron beam with current density approximatelly equal to 30-50 pA/nm$^2$.

DETAILED DESCRIPTION OF THE INVENTION

A novel nanofabrication method allowing fabrication of nanostructures with dimensions as small as ~3 nm is described. An approach consists of two main steps: (i) fabrication of metallic nanowires with diameters of about 10 nm or less, using molecular templates, and (ii) application of a focused electron beam for modification of morphology and local geometrical characteristics of nanowires, with a few-nanometer spatial resolution. Room temperature charging effects are predicted to be observable in electronic transport in such small devices. Below we describe in detail each of these steps and present examples of resulting structures.

Figure 1A:
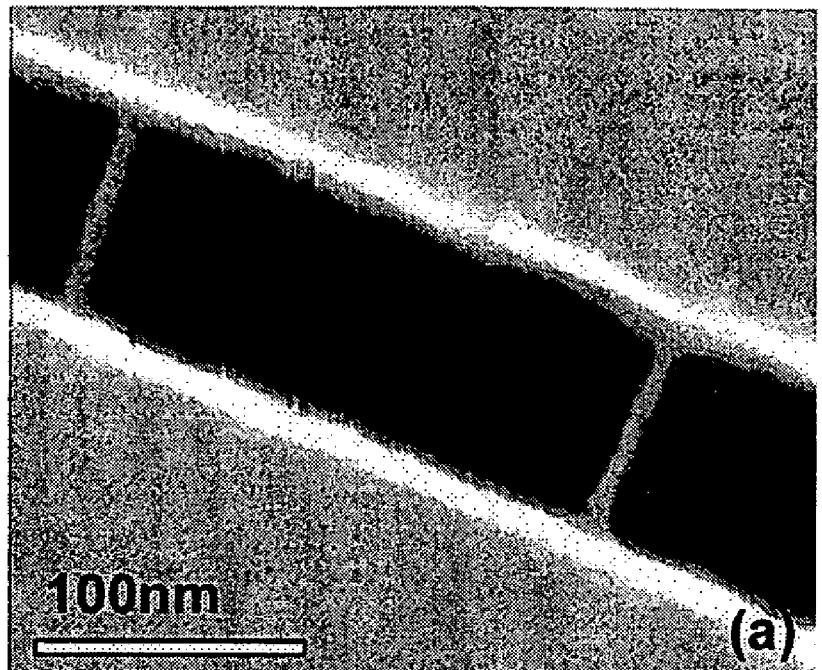
FIG. 1A shows two DNA-templated metallic nanowires are shown in this SEM micrograph. The molecules are covered with a 4 nm layer of amorphous Os metal. The widths of nanowires are ~8 nm and ~11 nm, correspondingly. The nanowires appear homogeneous, i.e. do not show any visible granularity.
Figure 1B:
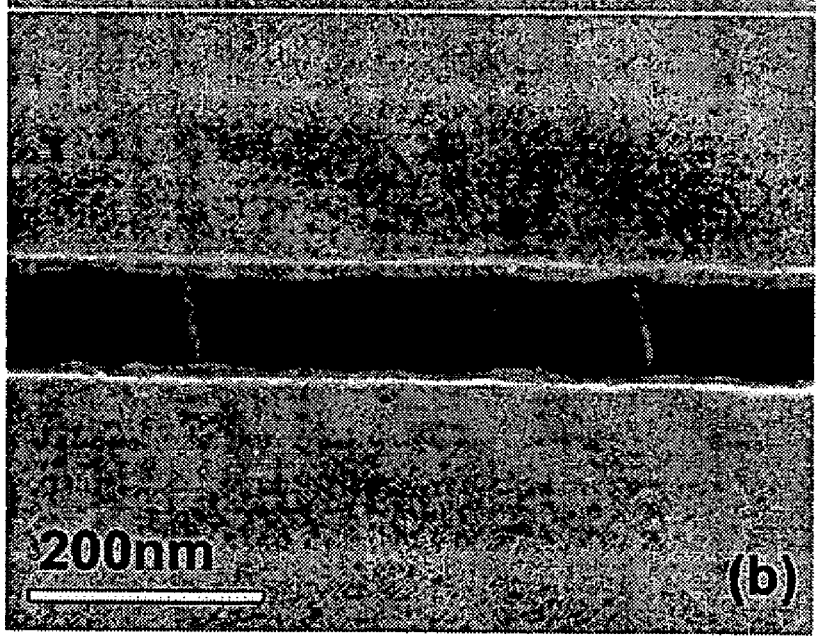
FIG. 1B shows a pair of DNA-templated nanowires, coated with 4 nm MoGe amorphous alloy. The wires, which also appear homogeneous, measure about 7 nm in width and ~85 nm in length.

Sub-10 nm wide homogeneous metallic nanowires can be fabricated using molecular templates. In this approach a single thread-like molecule, such as a carbon nanotube or a DNA double-helix, is placed over a substrate with a narrow (~0.1-1 µm) trench and a thin layer of metal is deposited over the molecule by sputtering. Examples of such wires are shown in FIG. 1. These samples were produced as follows: (1) a substrate containing narrow (~100 nm wide) and long (~5 mm) trenches for details of substrate fabrication) was placed into a solution with λ-DNA molecules and subsequently dried and coated with a desired metal. It is observed that some DNA molecules cross the trench. Such molecules are stretched by the Van der Waals force and produce perfectly straight nanowires.

Figure 2A:
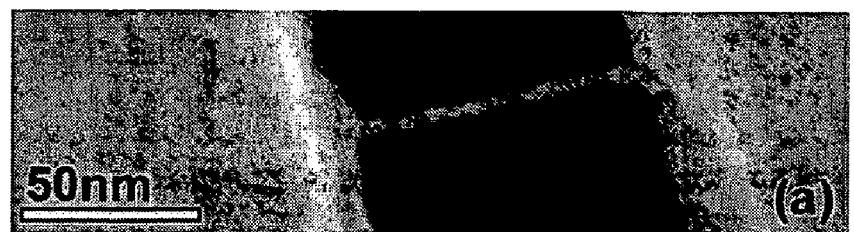
FIG. 2a shows a λ-DNA placed across a ~100 nm wide trench, then dried, and subsequently sputter-coated with a 1.5 nm thick layer of AuPd. This alloy is not truly amorphous. Therefore a significant granularity in the wire is clearly visible on the presented SEM micrograph. Some granularity patterns is also visible in thin AuPd film around the trench. The width of the wire is ~6 nm.
Figure 2B:
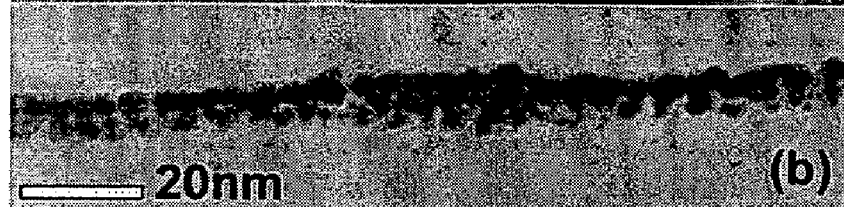
FIG. 2b shows a TEM micrograph of an equivalently prepared wire. The granularity is more pronounced in this image.

The choice of the coating metal is important. We observe that Au or AuPd coatings produce visible non-homogeneity (granularity) in the wires (FIG. 2). This is because these metals are not truly amorphous. In principle the adhesion of such metals to the underlying molecules is improved by sputtering a Ti sticking layer. Here we follow another approach and use amorphous metals to coat the molecules and thus obtain highly homogeneous nanowires with diameters below 10 nm, shown in FIG. 1. The first micrograph (FIG. 1a) presents a pair of wires produced by Os metal coating of suspended DNA molecules. The wires measure about 8 nm and 11 nm in width correspondingly. No granularity is visible. Another suitable material is the $Mo_{79}Ge_{21}$ alloy. It gives homogeneous superconducting wires, which can be produced on nanotube templates, as well as on DNA templates. Such DNA-templated wires exhibit metallic behavior and superconductivity at low temperatures, confirming their homogeneity. In experiments with carbon nanotubes templates it is found that nanowires with a high degree of homogeneity can be also formed by sputter-deposition of metallic Nb on carbon nanotubes. In the experiments on electron beam induced crystallization and sculpting (described below) we choose to use carbon-nanotube-templated Nb or MoGe wires.

Here we demonstrate a capability of modifying the crystal structure and geometric parameters of nanowires, with a high spatial resolution of about ~3 nm. A high energy focused electron beam is used for this purpose, under a direct visual control in a transmission electron microscope (TEM).

Samples used for e-beam sculpting were prepared by dipping a TEM holey carbon grid in an isopropyl alcohol solution containing fluorinated carbon nanotubes. Consequently the grids were dried with nitrogen gas and sputter-coated with a 3 to 6 nm film of Nb or $Mo_{21}Ge_{79}$. Magnetron DC sputtering of Nb was done at 2 mtorr Ar gas pressure, using a vacuum chamber with base pressure $10^{-7}$ torr, equipped with a liquid nitrogen trap. The MoGe alloy was sputtered in the same sputtering system, with 4 mtorr of Ar gas. Resulting wires ranged from 5 to 10 nm in width.

Electron irradiation was performed in a 200 keV JEOL JEM-2010F transmission electron microscope, equipped with a field emission gun (FEG). Intensity of the beam was adjusted by varying condenser apertures and spot sizes as well as focusing and spreading the beam. The current density was approximated by dividing the total electron current by the area covered by the beam. This approximation yielded results consistent within ~20% between different experiments, which is quite sufficient since the results are controlled by direct imaging in the same TEM machine and can be adjusted if necessary.

Figure 3A:
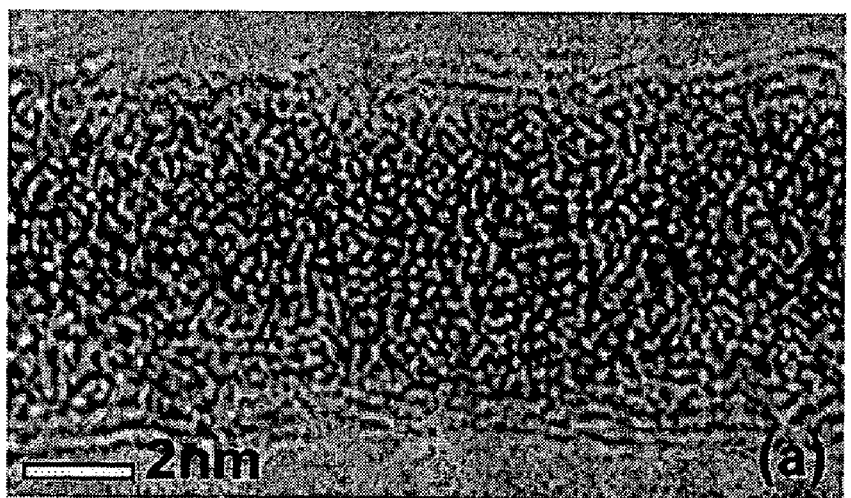
FIG. 3a shows an as-produced 5 nm wide Nb wire before intense irradiation. The wire was prepared by sputtering a 3 nm layer of Nb on a suspended nanotube. Unlike in FIG. 2 showing granular AuPd wire, no such granularity was observed on this amorphous Nb wire.
Figure 4A:
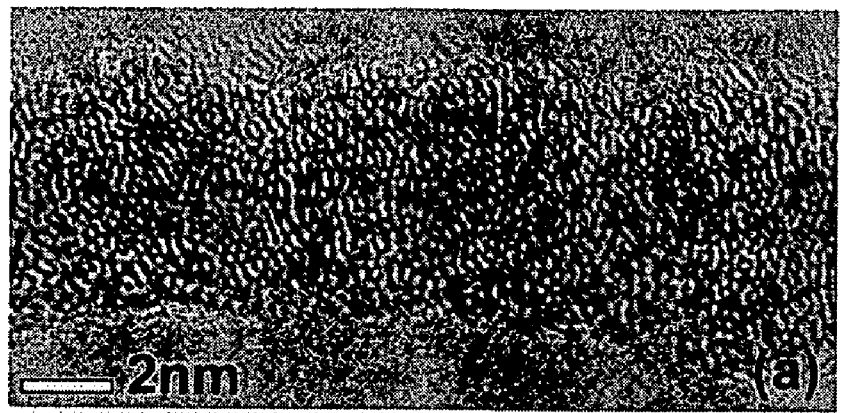
FIG. 4a shows a high resolution image of as-grown 5.5 nm wide MoGe. No granularity is observed on MoGe samples before e-beam exposure. The homogeneity of MoGe wires is related to their amorphous structure.

It is known form the literature that thin sputter-deposited films of MoGe are amorphous and continuous, while Nb films can have a nanocrystalline structure. Our TEM imaging, on the other hand, showed that nanotube-templated MoGe and thin-enough Nb wires are amorphous (FIG. 3a and FIG. 4a). Thicker Nb wires remained continuous but showed a nanocrystalline structure, for diameters larger than ~10 nm.

Figure 3B:
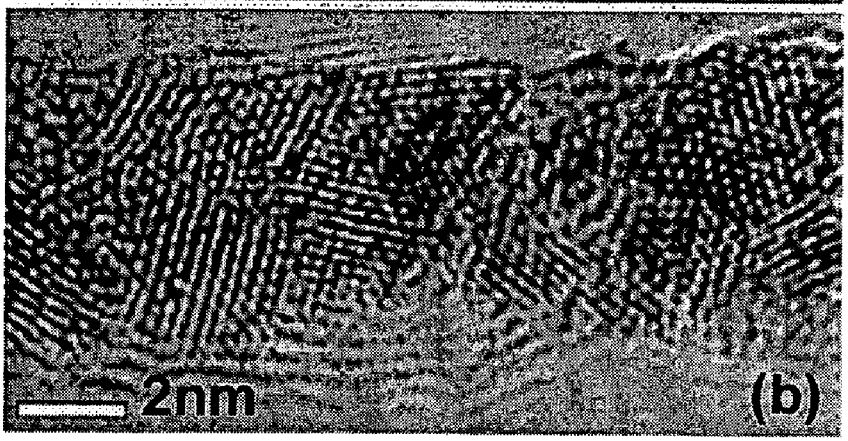
FIG. 3b shows the same wire after being exposed to a dose of electrons of ~700 pC/nm$^2$. The irradiation was performed under low current density, to avoid excessive sample heating (the intensity of ~0.4 pA/nm$^2$ sustained for 30 min).
Figure 4B:
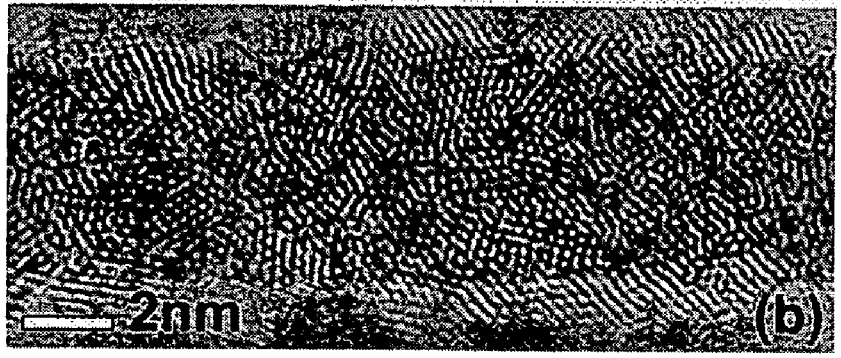
FIG. 4B shows the same wire after being subjected to an electron dose of ~900 pC/nm$^2$.

An important observation, which can be used in fabrication of nanodevices, is the possibility of modifying the crystal structure of nanowires under the influence of high energy electron radiation. We observed that amorphous wires of various diameters (~4 to 10 nm) became crystalline after a long-enough irradiation with the TEM beam. This effect is illustrated in FIG. 3, where a Nb nanowire is shown before (a) and after (b) the irradiation with a 200 keV electron beam. The irradiation was done by continuous imaging (using the same beam strength as used for regular TEM imaging) during a time interval of approximately 30 min. Note that some signatures of crystallization were observed already after 5 min of imaging. Irradiation of MoGe nanowires under similar condition was also carried out (FIG. 4). This figure shows that MoGe can be crystallized as effectively as Nb. An approximate minimum dose of electrons required to observe any crystallization in Nb or MoGe wires was 50 pC/nm$^2$. Tests with different beam intensities (current densities ranging from 0.3 pA/nm$^2$ to 30 pA/nm$^2$) showed that only the rate of crystallization depended on the intensity of the beam. Crystallization occurred at any intensity, suggesting that thermal heating effects are not very significant.

Electron beam induced crystallization, such as described above, has been studied previously on larger samples made of different materials: Si, Ge, GaAs, GeAu. We believe that the mechanism of crystallization described in these previous studies is also valid for the crystallization of our samples. Most importantly, the crystallization is not induced by heating the wire, but by displacement of atoms in electron-atom collisions. An energy threshold required to displace atoms depends on atomic mass of material and the bond strength. This displacement threshold, $E_D$, is the kinetic energy an atom needs to possess in order to be displaced. Approximate displacement threshold values for elements used are $E_D$=24 eV (for Nb), $E_D=27$ eV (for Mo), and $E_D=20$ eV (for Ge). Since electrons colliding with atoms can not transfer all their energy into the kinetic energy of the crystal atoms, they have to be accelerated to a much higher energies compared to the displacement threshold. The electronic energies required to initiate crystallization ($E_t$) are given by Hobbs formula $E_t=0.05[(0.2(100+AE_D))^{1/2}-10]$, where A is the atomic weight. We calculate the energies required to crystallize the sample as $E_t=579$ keV, 659 keV, and 380 keV respectively. Although the accelerating voltage of our TEM is 200 keV, it is still possible that electron-atom collisions play a key role in the observed crystallization (and also induce etching as discussed below). The reason for such conclusion is that multiple previous studies indicated that crystallization could be induced by electron irradiation with sub-threshold energies. Therefore we conclude that the observed crystallization of nanowires is induced by electron-atom collisions, and not by sample heating. This conclusion is also supported by the following two observations: (i) the crystallization was independent on the beam current density and (ii) a complete crystallization occurred at similar electron doses in samples with different geometrical characteristics.

Figure 5:
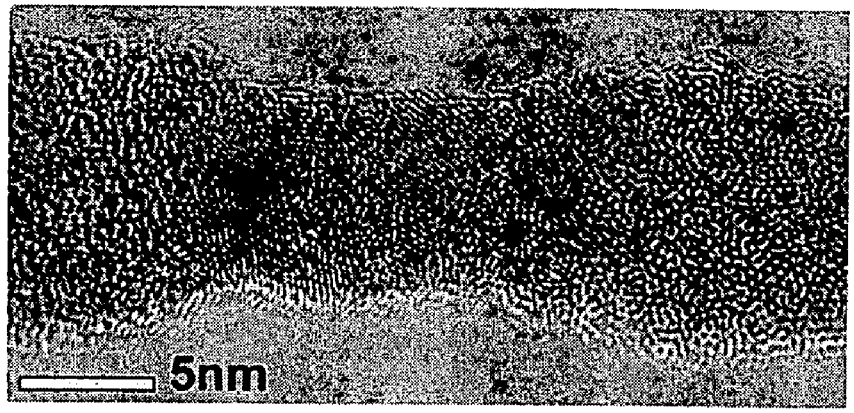
FIG. 5: Selective crystallization of an amorphous Nb nanowire. The ends of the wire have been exposed to a very low dose of e-beam radiation, which is just sufficient to take the picture. The ~11 nm long segment in the center of the wire received an e-beam dose of ~530 pC/nm (9 pA/nm$^2$ over 60s). The micrograph was obtained at a current density ten times lower that the one used to crystallize the center of the wire. Therefore the imaging did not cause significant crystallization.

We also successfully achieved spatially localized crystallization, i.e. a crystallization of a short segment of the wire. Good focus of the TEM beam allowed a small segment of the wire to be irradiated. Hence, sections of a wire could be selectively crystallized, leaving the rest of the wire amorphous. In such experiments the electron current density was kept at a value below 10 pA/nm$^2$ in order to avoid excessive heating and e-beam etching (see below) of the wire. FIG. 5 shows an example of an amorphous wire with an ~11 nm segment that has been crystallized by a TEM beam. This result can be used for the fabrication of sub-10 nm patterns within a single nanowire.

Another effect that occurs along with crystallization is an etching or sputtering of the wire, induced by e-beam irradiation. Sputtering of the metal from the nanowire is expected for electron energies above 50% of the displacement threshold. This effect is expected to occur at any beam current density, because it depends only on the energy of incident electrons. In our experiments crystallization occurred much more rapidly than sputtering of the material. Therefore, using a minimum electron dose and low current density (below 10 pA/nm$^2$) provided us enough control to be able to crystallize samples without causing noticeable material loss.

Figure 6A:
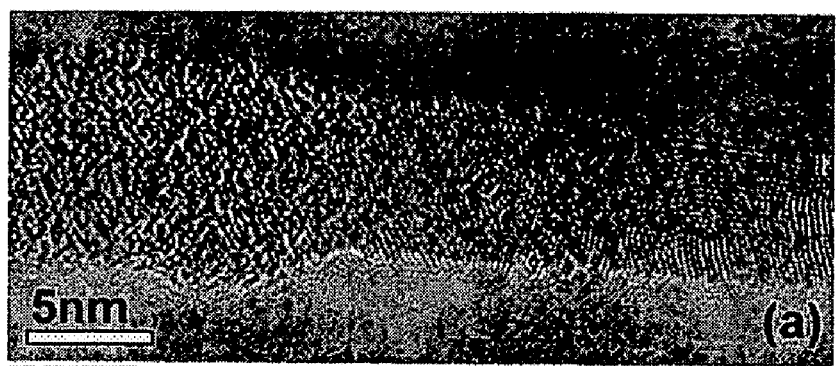
FIG. 6a shows electron beam induced crystallization and etching of a nanowire. Initial diameter of the nanowire was ~9 nm. The right side of the wire was selectively exposed to electron-beam radiation. The right side is crystallized and reduced in diameter (new diameter is ~6 nm), while the left side is unchanged and remains amorphous.

FIG. 6 shows a nanowire before and after an exposure to a focused electron beam for 60s, with current density of ~20 pA/nm$^2$. In this test the electron beam was focused in such way that only the right side of the wire was exposed to intense e-beam radiation. We find that the right side of the wire was not only crystallized but also was reduced in diameter. The width of the transition region between the unexposed left side (which remains amorphous) and the exposed right side (which is crystallized and reduced in diameter by the e-beam etching) is about 3 nm. Such processing can potentially be used to manufacture wires of very specific diameters, significantly smaller than 10 nm. It is also important that a direct visual control is provided in the TEM, so the etching process can be stopped as soon as the desired shape of the wire is achieved.

Figure 6B:
FIG. 6b shows the same wire after an exposure to air at room temperature for 1 hour. Some oxidation (~1-2 nm) is evident on the surface. However, the characteristic pattern of fringes, representing nanocrystals, is still present at the core of the wire.

In order to test the stability of thus obtained wires, this wire was removed from the TEM, after the completion of the crystallization, and exposed to air at room temperature for 1 hour. Subsequent imaging of the wire (FIG. 6*b*) showed that some oxidation occurred, however the crystalline pattern in the core of the wire was mostly unaffected (FIG. 6*b*). Thus the wires show a promising stability for room-temperature nanodevices. Note that the local e-beam etching described here can be exploited as a powerful method allowing modification and local tuning of the wire diameter at a scale and with a resolution of just a few nanometers, under direct visual control.

Figure 7A:
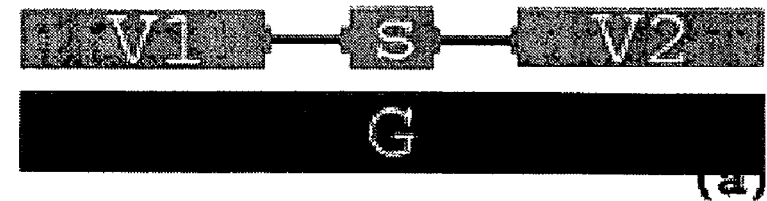
FIG. 7a provides a schematic of an SET transistor. V1, V2 are the source and drain electrodes correspondingly. The Coulomb island is marked "S" and represent the central metallic grain with a localized electronic cloud. The localization is achieved due to barriers shown schematically as solid lines. The gate electrode, marked "G" can be used for tuning the electric potential of the Coulomb island, thus controlling the electrical current through the Coulomb island.
Figure 7B:
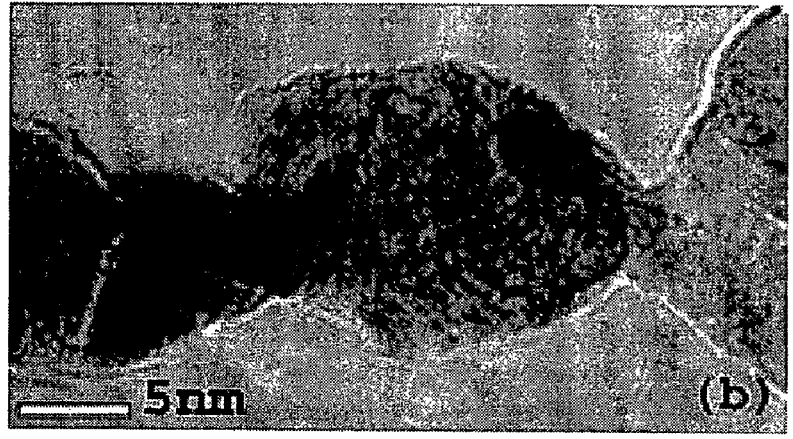
FIG. 7b shows a micrograph of an e-beam produced structure that can possibly function as an SET device is shown. Two constrictions were created in an 15 nm Nb wire, and positioned approximately 20nm apart. The gate is not present.

Locally changing the wire diameter can be applied for fabrication of local barriers, which can be used to limit the propagation of electrons along the wire and, if sufficiently strong, to localize the electronic wave function between a pair of barriers. A structure with two e-beam etched barriers is shown in FIG. 7. Such system functions as a single electron transistor. The principle is the following (FIG. 7*a*): (i) The barriers (shown as solid lines) localize the electrons on the Coulomb island (S) defined by the two constrictions. If the resistance of the barriers is larger than the quantum resistance $h/e^2 \approx 26$ kΩ, then the number of electrons on the island is an integer, because the wave function of each electron is localized on the Coulomb island in such case. (ii) For an electrical current to flow through such wire with two constrictions, an additional electron has to be introduced on the island from the source electrode (V1) and then released to the drain (V2). Such change of the charging number of the island is energetically unfavorable since the size of the island is small and its capacitance is small too, thus its charging energy is large. (iii) It is possible to "open" the transistor (i.e. lift the Coulomb blockade) by tuning the voltage on the gate electrode (G) to a degeneracy point at which the electrostatic energy of the device is the same for N and N+1 additional electrons placed on the island. The degeneracy of the charging state means that $E_N=E_{N+1}$, where $E_N(E_{N+1})$ is the energy of the device with N(N+1) extra electrons introduced on the Coulomb island. If such degeneracy is present then a sequential process of a type N→N+1→N is possible at any temperature, leading to an electrical current through a device. Thus the current through the wire can be controlled and a transistor effect is possible. Experimentally such transistors have been extensively studied. The new result we report is the fabrication method that gives extremely small device with high charging energies and consequently high expected operation temperatures.

Figure 8:
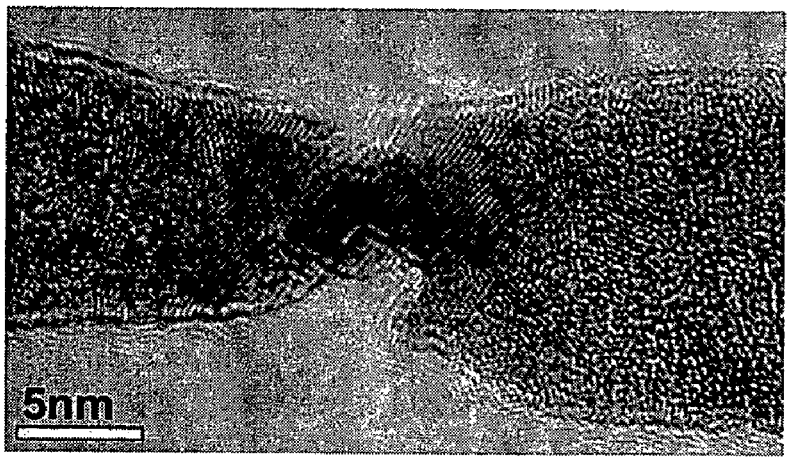
FIG. 8 shows electron-beam sculpting of a constriction with a ~3.5 nm wide grain. The nanograin is created in the wire by a focused electron beam, which possibly can melt the material locally. The middle segment has been subjected to irradiation, while the ends are still amorphous, confirming that the electron beam was well focused. The structure can function as a room-temperature single-electron device.

A qualitatively different phenomenon was observed at even higher irradiation current densities (20-30 pA/nm$^2$). At such conditions the material of the wire was not only sputtered away and crystallized, but also formed well-defined nanometer-size grains at the points of greatest intensity of the beam (FIG. 8). Visual observation of the process suggests that local melting occurs in such case. The phenomenon is more pronounced in wires with smaller diameters, suggesting a mechanism involving overheating and local melting of the wire. In FIG. 8 we present an example of a nanograin formed at the constriction that was created by a high intensity strongly focused electron beam. If the resistance between the grain and the wire is high enough, the resulting device acts as an SET transistor. Such focused e-beam melting gives the smallest grain size in the range ~3.5 nm. The charging energy for such nanograins can be estimated 0.5 eV or 6000K, much higher than the room temperature. Thus such single electron tunneling devices is predicted to show a transistor effect even at room temperature. Observation of discreteness of the electronic spectrum could also be achieved with such samples.

Figure 9A:
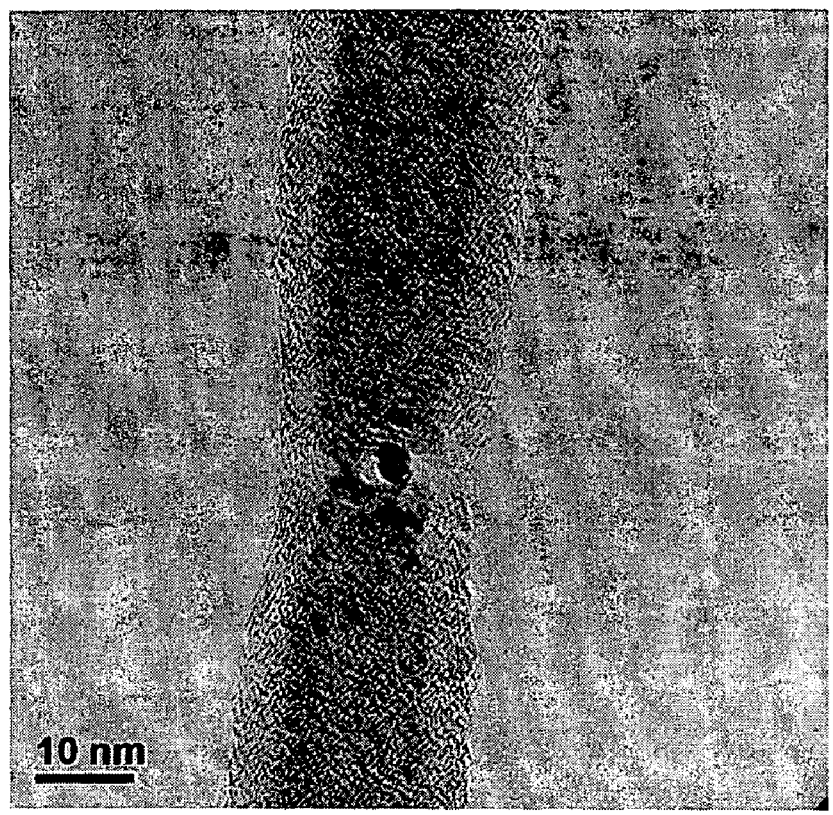
FIGS. 9A and 9B provide transmission electron micrographs exemplifying another processing method of the present invention wherein exposure of a region of nanowire to a focused electron beam provides a means of locally removing material, thereby generating holes in the nanowire.
Figure 9B:
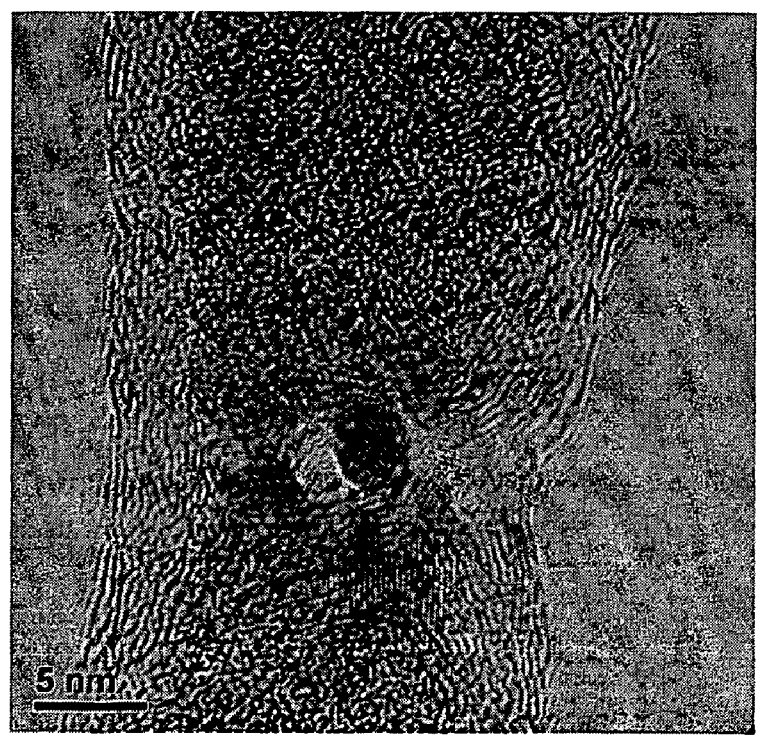
Figure 10:
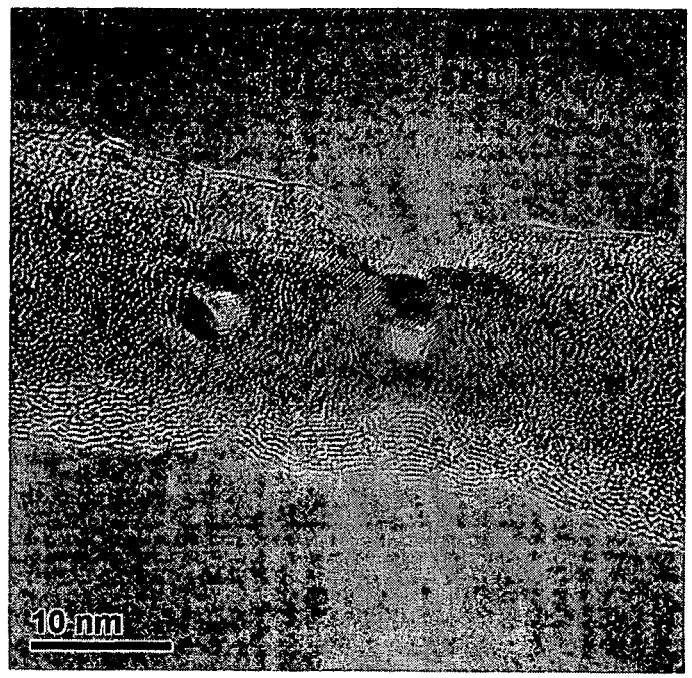
FIG. 10 provides a transmission electron micrograph of a nanowire having two holes positioned proximate to each other (e.g. within about 10 nanometers) that provide conduction constriction segments of a SET transistor.

FIGS. 9A and 9B provide transmission electron micrographs exemplifying another processing method of the present invention wherein exposure of a region of nanowire to a focused electron beam provides a means of locally removing material, thereby generating holes in the nanowire. As shown in FIGS. 9A and 9B this processing technique is capable of generating a hole having selected physical dimensions, such as diameter, and having a selected position along the length of the nanowire. Fabrication of nanostructures comprising segments of a nanowire having one or more holes, including holes extending entirely through the nanowire, is useful for making conduction constricting segments in nanowire based electrical devices. FIG. 10 provides a transmission electron micrograph of a nanowire having two holes positioned proximate to each other (e.g. within about 10 nanometers) that provide conduction constriction segments of a SET transistor. The patterned nanowire structure shown in FIG. 10 is expected to comprise a SET transistor capable of room temperature operation.

In conclusion, we prepare suspended metallic nanowire with sub-10 nm diameters and observed four related but distinct processes caused by the electron-beam irradiation: (1) Crystallization of initially amorphous nanowires. (2) Local crystallization induced by a focused electron beam, (3) Local etching (or sputtering) of the wire observed after a longer exposure to the e-beam. (4) Possible melting and formation of a single nanograin in the wire, caused by a highly focused e-beam of high intensity. Crystallization is expected to be caused by knock-on atom displacements. Loss of material (etching) was observed at any intensity of the beam, however, only became significant at electron doses up to 2-3 times those required to cause complete crystallization. Formation of grains was observed at highest beam intensities (current density above 20 pA/nm$^2$) and also appeared to be more prevalent in thin wires (~3 nm). This fact suggests that formation of grains is caused by local heating of the wire, hence it only occurs when heat transferred from the e-beam is not conducted away too rapidly and is sufficient for the melting to occur.

EXAMPLE 1

Electronic and Mechanical Properties of Nanowire Structures and Devices

It is a goal of the present invention to provide nanowire structures and nanowire devices exhibiting electronic and mechanical properties beneficial for a variety of applications, including nanoelectronics, nanoelectromechanical systems, sensing, memory devices and quantum computing. To demonstrate the capability of the present invention to support a range of useful device structures and applications, the electronic and mechanical behavior of nanowire structures were experimentally characterized. Nanowire structures exhibiting superconductivity and nanowire structures exhibiting electronic properties that vary upon irradiation with an electron beam are exemplified and described.

Figure 11:
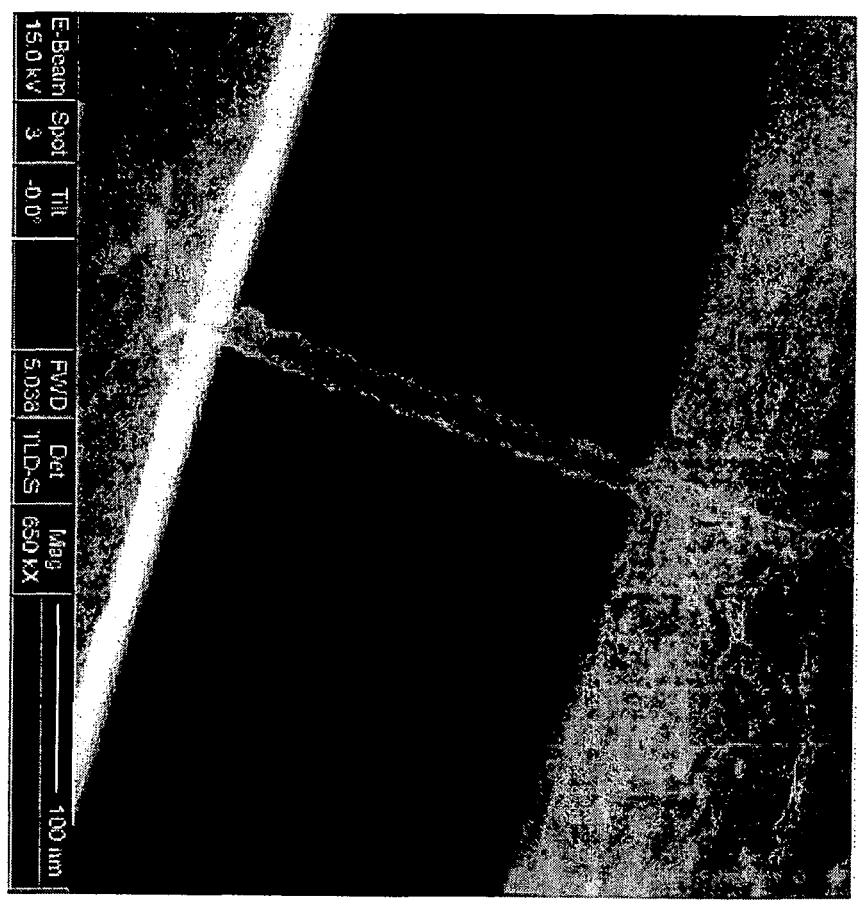
FIG. 11 shows a SEM (scanning electron microscopy) micrograph of a nanowire structure of the present invention.

FIG. 11 shows a SEM (scanning electron microscope) micrograph of a nanowire structure of the present invention. Nanowires of this example were fabricated using single walled carbon nanotube molecular templates, which were positioned so as to be suspended over a slit (i.e., a channel) in a SiN membrane. Focused ion beam lithography was used to fabricate the slits (about 180 nanometers wide, about 500 (the thickness of the membrane) nanometers deep and about 10 microns long) in the membrane. Nanowire formation was achieved by sputtering deposition of an about 10 nanometer layer of MoGe on the single walled carbon nanotube molecular template structures.

The substrate with the nanowire was subsequently patterned using optical lithography. The same film that was deposited onto the substrate to form the wire, was used to form the electrodes. (I.e. the wire is positioned in the middle of a SiN membrane, that is positioned in the middle of a SiN/Si chip (3×3 mm chip, with a 0.1×0.1 mm membrane)). The whole top surface of the chip is sputter coated with the metal, then optical lithography is used to pattern the metal around the wire. The electrode and the wire are already part of the same film, however the exact shape of the edges of the slit, establishes how well the wire is connected to the rest of the film.

It is important to note that the nanowires were not damaged during electrode deposition, patterning and processing steps, thereby demonstrating that nanowires of the present invention are mechanically robust and capable of surviving subsequent system processing, for example via optical lithography and dry and wet chemical etching processing. Further, nanowire structures of the present invention were also observed to not be damaged significantly upon exposure to an oxygen plasma.

Figure 12:
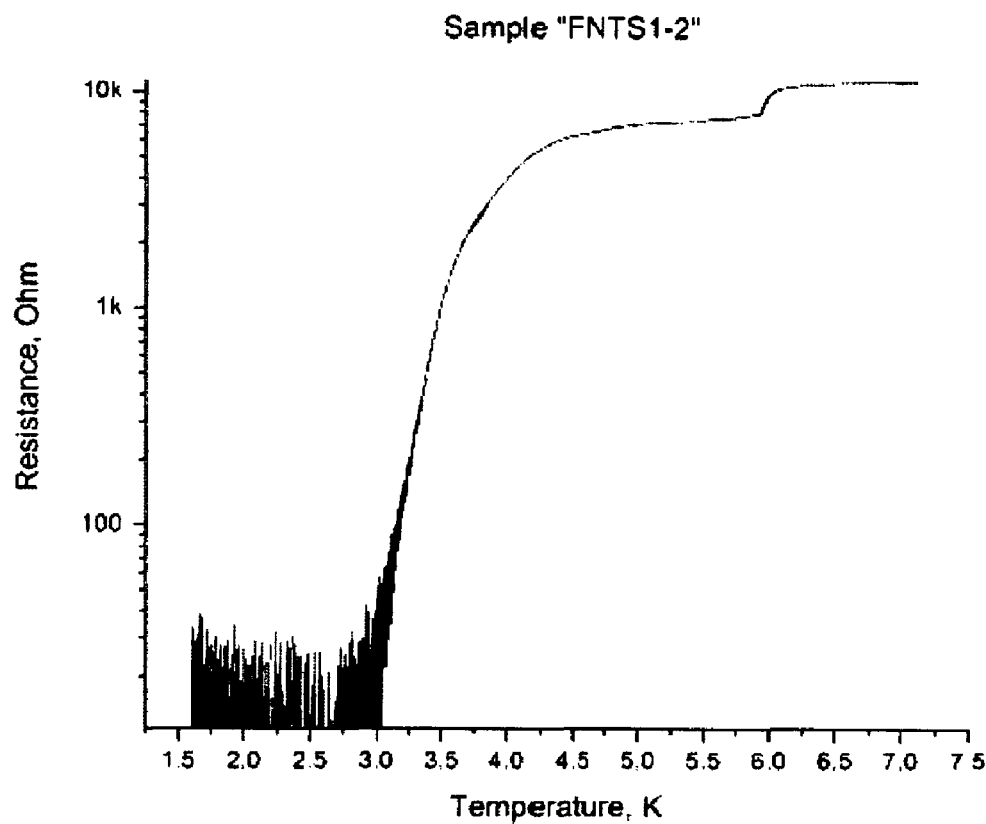
FIG. 12 shows a plot of resistance as a function of temperature for the nanowire structure shown in FIG. 11 that demonstrates that the nanowire exhibits superconducting electronic behavior.
Figure 13:
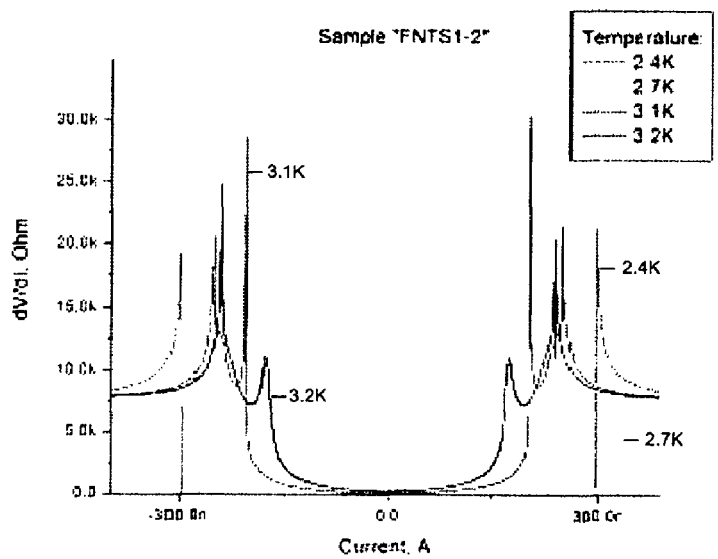
FIG. 13 shows a set of dV/dI versus current graphs for temperatures equal to 2.4 K, 2.7 K, 3.1 K and 3.2 K, which is also consistent with superconducting electronic behavior.

The nanowire shown in FIG. 11 was observed to exhibit superconductivity. In these experiments superconductivity was confirmed by measuring the resistance of the nanowire as a function of temperature. FIG. 12 shows a plot of resistance as a function of temperature for the nanowire structure shown in FIG. 11 that demonstrates that the nanowire exhibits superconducting electronic behavior at low temperatures. FIG. 13 shows a set of dV/dI versus current graphs for temperatures equal to 2.4 K, 2.7 K, 3.1 K and 3.2 K, which is also consistent with superconducting nanowire electronic behavior.

Figure 14A:
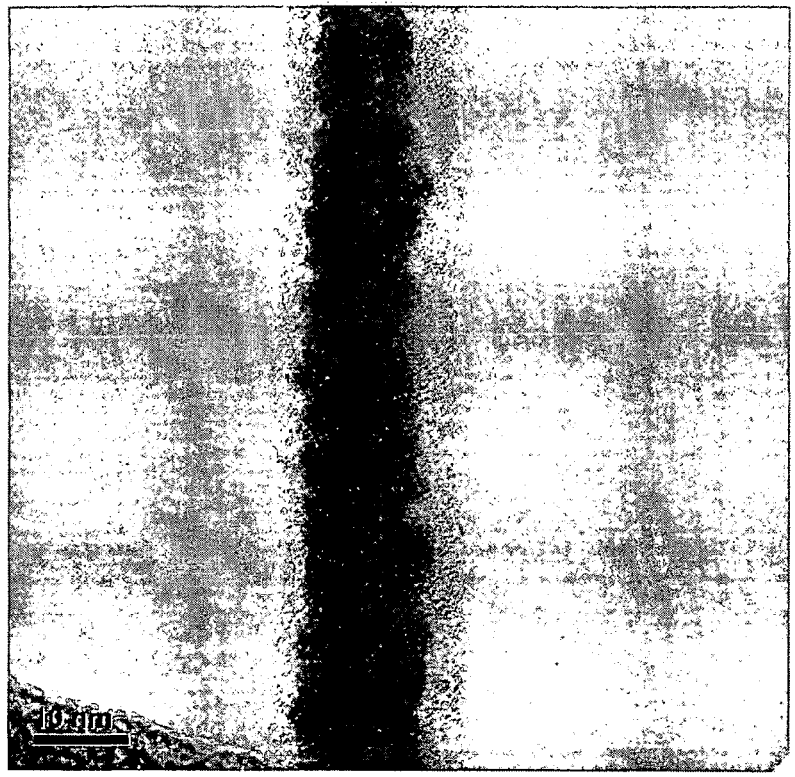
FIGS. 14A and 14B shows a nanowire structure of the present example that did not exhibit superconductivity.
Figure 14B:
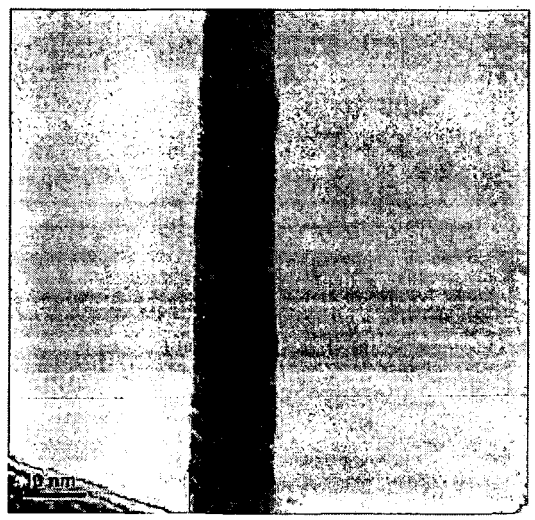
Figure 15:
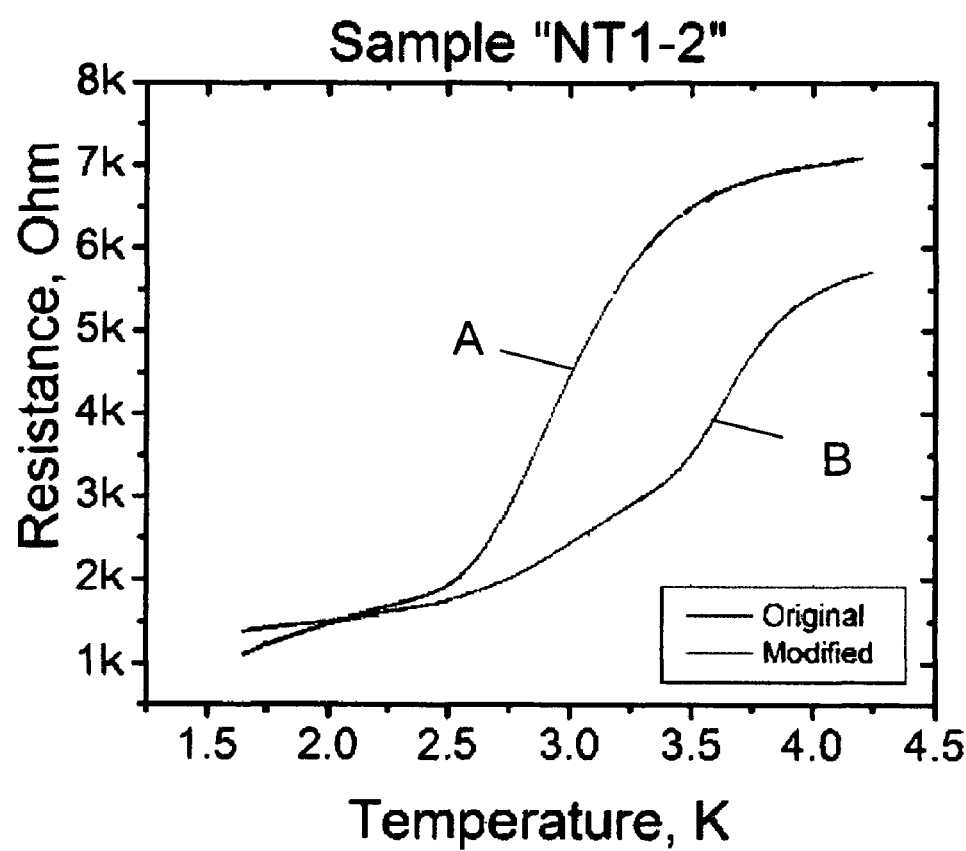
FIG. 15 shows plots of resistance versus temperature for the original nanowire structure (plot A) and for the nanowire structure after electron irradiation (plot B).

FIGS. 14A and 14B show a nanowire structure of the present example that exhibited electronic properties that varied upon exposure to an electron beam. FIG. 14A shows the nanowire as originally prepared via sputtering deposition and FIG. 14B shows the nanowire after annealing for 20-30 seconds with an electron beam having current density equal to 30-50 pA/nm$^2$. FIG. 15 shows plots of resistance versus temperature for the original nanowire structure (plot A) and for the nanowire structure after electron beam irradiation (plot B). As shown by a comparison of the plots in FIG. 15, the resistance of the nanowire structure decreased significantly after exposure to the electron beam. These measurements also confirm that the conductivity of the nanowire structures were able to be measured before and after TEM modification. Also, these measurements verify that the processing methods of the present invention are useful for selectively adjusting the electronic properties of metallic nanowire structures.

STATEMENTS REGARDING INCORPORATION BY REFERENCE AND VARIATIONS

The reference "Effect of Morphology on the Superconductor-Insulator transition in one-dimension nanowires", A. T. Bollinger, A. Rogachev, M. Remeika and A. Bezryadin, PHYSICAL REVIEW B, 69, 180503 (2004) provides information relating to the electronic properties of nanowire structures and is incorporated herein by reference in its entirety. All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Any appendix or appendices hereto are incorporated by reference as part of the specification and/or drawings.

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

We claim:

1. A method for patterning a conductive nanowire to form a plurality of conductive segments and conductance constricting segments, said method comprising the steps of:
providing a suspended linear template molecule;
depositing a layer of material on said suspended linear template molecule, thereby providing said nanowire, wherein a diameter of said nanowire is less than about 50 nanometers;
exposing a first region of said nanowire to a focused beam of electrons, thereby generating a first conductance constricting segment;
exposing a second region of said nanowire to the focused beam of electrons, thereby generating a second conductance constricting segment, wherein said first and second conductance constricting segments are separated by and in electrical contact with a middle conductive segment of said nanowire, thereby patterning said conductive nanowire to form said plurality of conductive segments and conductance constricting segments;
wherein said focused beam of electrons has a current density equal to a value selected from the range of about 0.1 pA nm$^{-2}$ to 50 pA nm$^{-2}$.

2. The method of claim 1 wherein said step of exposing at least one of said regions of said nanowire to said focused beam of electrons comprises locally etching a portion of said nanowire, thereby generating at least one conductance constricting segment having an average cross sectional dimension equal to 6 nanometers or less and extending along said nanowire a distance equal to a value selected over the range of about 5 nanometers to about 100 nanometers.

3. The method of claim 1 wherein said first conductance constricting segment, said second conductance constricting segment and said middle conductive segment are integrated components of said nanowire.

4. The method of claim 1 wherein said step of exposing at least one of said regions of said nanowire to said focused beam of electrons comprises locally melting a portion of said nanowire thereby generating at least one conductance constricting segment having an average cross sectional dimension equal to about 6 nanometers or less and extending along said nanowire a distance equal to a value selected over the range of about 5 nanometers to about 100 nanometers.

5. The method of claim 1 wherein said step of exposing at least one of said regions of said nanowire to said focused beam of electrons comprises locally melting a portion of said nanowire, thereby generating an embedded grain bounded by said first and said second conductance constricting segments, wherein said grain comprises said middle conductive segment of said nanowire.

6. The method of claim 1 wherein said step of exposing at least one of said regions of said nanowire to said focused beam of electrons comprises making a hole in said nanowire, thereby generating at least one conductance constricting segment.

7. The method of claim 1 further comprising exposing at least one of said conductance constricting segments to an oxidizing medium, thereby generating at least one conductance constricting segment comprising an oxide segment.

8. The method of claim 1 wherein said layer of material comprises a metal, metal alloy or semiconductor.

9. The method of claim 1 wherein said linear template molecule is selected from the group consisting of: single stranded DNA; double stranded DNA; single stranded RNA; double stranded RNA; a carbon nanotube; carbon fiber; a boron nitride nanotube; an oligonucleotide; a peptide; an actin fiber and a microtubulus.

10. The method of claim 1 wherein said suspended linear template molecule is provided across a trench on a substrate surface.

11. A method for patterning a conductive nanowire to form a plurality of conductive segments and conductance constricting segments, said method comprising the steps of:
providing a suspended linear template molecule;
depositing a layer of material on said suspended linear template molecule, thereby providing said nanowire, wherein a diameter of said nanowire is less than about 50 nanometers;
exposing a first region of said nanowire to a focused beam of electrons, thereby generating a first conductance constricting segment;
exposing a second region of said nanowire to the focused beam of electrons, thereby generating a second conductance constricting segment, wherein said first and second conductance constricting segments are separated by and in electrical contact with a middle conductive segment of said nanowire, thereby patterning said conductive nanowire to form said plurality of conductive segments and conductance constricting segments;
wherein said step of exposing said first region of said nanowire to said focused beam of electrons and said step of exposing said second region of said nanowire to said focused beam of electrons each comprise exposing said nanowire to a net dose of electrons equal to a value selected from the range of about 10 pC nm$^{-2}$ to 100 pC nm$^{-2}$.

12. The method of claim 11 wherein said step of exposing at least one of said regions of said nanowire to said focused beam of electrons comprises locally etching a portion of said nanowire, thereby generating at least one conductance constricting segment having an average cross sectional dimension equal to 6 nanometers or less and extending along said nanowire a distance equal to a value selected over the range of about 5 nanometers to about 100 nanometers.

13. The method of claim 11 wherein said first conductance constricting segment, said second conductance constricting segment and said middle conductive segment are integrated components of said nanowire.

14. The method of claim 11 wherein said step of exposing at least one of said regions of said nanowire to said focused beam of electrons comprises locally melting a portion of said nanowire thereby generating at least one conductance constricting segment having an average cross sectional dimension equal to about 6 nanometers or less and extending along said nanowire a distance equal to a value selected over the range of about 5 nanometers to about 100 nanometers.

15. The method of claim 11 wherein said step of exposing at least one of said regions of said nanowire to said focused beam of electrons comprises locally melting a portion of said nanowire, thereby generating an embedded grain bounded by said first and said second conductance constricting segments, wherein said grain comprises said middle conductive segment of said nanowire.

16. The method of claim 11 wherein said step of exposing at least one of said regions of said nanowire to said focused beam of electrons comprises making a hole in said nanowire, thereby generating at least one conductance constricting segment.

17. The method of claim 11 further comprising exposing at least one of said conductance constricting segments to an oxidizing medium, thereby generating at least one conductance constricting segment comprising an oxide segment.

18. The method of claim 11 wherein said layer of material comprises a metal, metal alloy or semiconductor.

19. The method of claim 11 wherein said linear template molecule is selected from the group consisting of: single stranded DNA; double stranded DNA; single stranded RNA; double stranded RNA; a carbon nanotube; carbon fiber; a boron nitride nanotube; an oligonucleotide; a peptide; an actin fiber and a microtubulus.

20. The method of claim 11 wherein said suspended linear template molecule is provided across a trench on a substrate surface.

* * * * *